United States Patent
Bensch

(10) Patent No.: US 7,692,202 B2
(45) Date of Patent: Apr. 6, 2010

(54) SEMICONDUCTOR STRUCTURE COMPRISING ACTIVE ZONES

(75) Inventor: Werner Bensch, Nordheim (DE)

(73) Assignee: Azur Space Solar Power GmbH, Heilbronn (DE)

(*) Notice: Subject to any disclaimer, the term of this patent is extended or adjusted under 35 U.S.C. 154(b) by 429 days.

(21) Appl. No.: 10/586,946

(22) PCT Filed: Jan. 26, 2005

(86) PCT No.: PCT/EP2005/000759

§ 371 (c)(1),
(2), (4) Date: Aug. 23, 2006

(87) PCT Pub. No.: WO2005/073485

PCT Pub. Date: Aug. 11, 2005

(65) Prior Publication Data

US 2007/0158659 A1    Jul. 12, 2007

(30) Foreign Application Priority Data

Jan. 29, 2004  (DE) ............... 10 2004 004 765

(51) Int. Cl.
*H01L 33/00* (2006.01)

(52) U.S. Cl. ............... 257/96; 257/94; 257/97; 257/E33.012; 257/E33.047

(58) Field of Classification Search ........... 257/94, 257/96, 97, E33.047, E33.012, E33.013, 257/E33.014

See application file for complete search history.

(56) References Cited

U.S. PATENT DOCUMENTS

| 5,166,761 | A |   | 11/1992 | Olson et al. |
| 5,212,706 | A | * | 5/1993 | Jain ............... 372/50.1 |
| 5,739,552 | A |   | 4/1998 | Kimura et al. |
| 6,563,139 | B2 | * | 5/2003 | Hen ............... 257/89 |
| 6,822,991 | B2 | * | 11/2004 | Collins et al. ........ 372/43.01 |
| 2002/0167014 | A1 |   | 11/2002 | Schlereth et al. |

(Continued)

FOREIGN PATENT DOCUMENTS

EP    0727830    8/1996

(Continued)

OTHER PUBLICATIONS

Ozden et al, "A Dual-Wavelength Indium Gallium Nitride Quantum Well Light Emitting Diode", Applied Physics Letters 0003-6951, Vo. 79, No. 16, 2001, pp. 2532-2534.

(Continued)

*Primary Examiner*—Shouxiang Hu
(74) *Attorney, Agent, or Firm*—Dennison, Schultz & MacDonald

(57) ABSTRACT

A semiconductor structure with active zones, such as light diodes or photodiodes, including a substrate (SUB) with at least two active zones (AZ1-AZn), each of which emits or absorbs a radiation of differing wavelength. According to the invention, a multi-wavelength diode may be achieved, in which a first (lower) active zone (AZ1) is grown on a surface of the substrate (SUB), with one or several further active zones (AZ1-AZn) epitaxially grown one on the other and the active zones (AZ1-AZn) are serially connected from the lower active zone (AZ1) to an upper active zone (AZn), by means of tunnel diodes (TD1-TDn), serving as low-impedance resistors.

11 Claims, 12 Drawing Sheets

U.S. PATENT DOCUMENTS

2005/0067627 A1    3/2005  Shen et al.
2006/0162768 A1*   7/2006  Wanlass et al. ............. 136/262

FOREIGN PATENT DOCUMENTS

| EP | 0649202 | 2/1997 |
| EP | 1403935 | 3/2004 |
| WO | 0077861 | 12/2000 |

OTHER PUBLICATIONS

Contour et al, "(GaAl) As Tunnel Junctions Grown by Molecular Beam Epitaxy: Intercell OHMIC Contacts for multiple-Band-Gap Solar Cells" Solar Cells Switzerland, 1984, pp. 667-676.

* cited by examiner a)

b)

a)

b)

a)

b)

EP2005/000759, filed Jan. 26, 2005.

SEMICONDUCTOR STRUCTURE COMPRISING ACTIVE ZONES

This application is a filing under 35 USC 371 of PCT/EP2005/000759, filed Jan. 26, 2005.

BACKGROUND OF THE INVENTION

The invention relates to a semiconductor structure with active zones, and to a method for manufacturing such a semiconductor. The invention further relates to a blended-color sensor, and to a colored display that contains the semiconductor structure with the active zones.

A semiconductor structure with active zones of the type mentioned above is described in an article by I. Ozden, et al.: "A dual-wavelength indium gallium nitride quantum well light emitting diode" in Applied Physics Letters, Vol. 79, No. 16, 2001, pp 2532-2534. This article deals with a monolithic, dual wavelength (blue/green) light-emitting diode (LED) with two active indium-gallium-nitride/gallium nitride (InGaN/GaN) multiple quantum well segments. The segments are part of a single vertical epitaxial structure, in which a $p^{++}/n^{++}$/InGaN/GaN tunnel junction is inserted between the LED's. The segments emit at 470 nm and 535 nm, respectively.

EP-A-1 403 935 describes a light-emitting diode with a first active zone, a second active zone and a tunnel junction. The tunnel junction comprises one layer of a first conductive type and one layer of a second conductive type, both of which are thinner than one layer of a first conductive type and one layer of a second conductive type, which encompass the first active zone. The tunnel junction permits the vertical stacking of the active zones, whereby the light that is generated by the element can be increased without increasing the size of the light source.

EP-A-0 727 830 relates to a method for producing a light-emitting diode (LED) with a plurality of layers comprising adjacent first and second layers, which are connected to a connecting piece. Production can be carried out according to the wafer-bonding method. Multiple LED structures can be connected with other layers if the intermediate layer is designed such that a high degree of electrical conductivity through the element is ensured. The type of doping in the layers of the upper LED structure corresponds to the type of doping in the layers of the lower LED structure. Thus the two LED structures are arranged with the same polarity relative to one another. The surfaces to be bonded to one another (wafer bonding) should be very highly doped. When the structures are bonded, a highly doped tunnel junction with opposite polarity of the LED's is formed. As an alternative it is proposed that the tunnel junction is grown epitaxially.

From WO-A-00/77861 a semiconductor structure with active zones is known, comprising a plurality of active layers that are selective for various wavelengths, which layers are arranged in a vertical stack on a substrate, so that the incident light is able to pass through the layers with evenly decreasing band gaps. In this, photons of differing energy are selectively absorbed or emitted by the active layers. Contact elements are arranged separately on the outer sides of each layer or a set of layers having the same parameters, in order to remove the charges that are generated in the photon-absorbing layers, and/or to introduce charge carriers into the photon-emitting layers. This element is intended for use, for example, in displays or solar cells.

EP-B-0 649 202 relates to a semiconductor laser and the method for producing it. The semiconductor laser comprises a plurality of semiconductor chips sandwiched by soldering them one on top of another such that their laser emission surfaces are arranged coplanar relative to one another, with each laser chip having a substrate with epitaxial layers applied thereon, including one active layer.

From WO 99/57788 a further light-emitting semiconductor device of the type described above is known. In this publication a dual-color light-emitting semiconductor device is described, which has, between its front side and its back side, a first surface-emitting light-emitting diode with a first active zone, which emits radiation of a first wavelength, and a second surface-emitting light-emitting diode with a second active zone, which emits radiation of a second wavelength, wherein between the two active zones a first reflective layer is arranged, which is reflective for the first wavelength and is transparent for the second wavelength. It is further provided that between the second active zone and the back a second reflective layer is arranged, which is reflective for the second wavelength. The reflective layers result in improved utilization of the light from both diodes that is radiated in the direction of the back and are preferably formed from a multilayer system of layers with alternating high and low refractive indices, wherein the layers are preferably constructed from a semiconductor material adapted to a lattice.

In the prior art semiconductor device, the active zones are applied to two opposite surfaces of a substrate, so that a beam of light emitted from the lower active zone must pass through the substrate and at least one reflective layer, whereby optical losses are possible. Furthermore, with the known light-emitting semiconductor device, only two light beams can be generated. Thus its use in a colored display is limited.

SUMMARY OF THE INVENTION

On the basis of this as prior art, the object of the present invention is to further develop a semiconductor structure with active zones and a method for manufacturing such a structure, with which the disadvantages of the prior art can be eliminated. Especially, a light-emitting semiconductor device and a method for manufacturing such a device are to be further developed such that the light yield is improved, the manufacturing method is simplified, and multiple photon emission peaks of differing wavelengths can be generated within a semiconductor material.

The object is attained according to the invention with a first embodiment in that the semiconductor structure is designed as a multi-wavelength diode that emits or absorbs a defined number of light wavelengths, in that between the lower active zone and the upper active zone one or more additional active zones are epitaxially grown, in that the lowest active zone has a low energetic band gap, wherein each of the subsequent active zones has a higher energetic band gap than that of a preceding active zone, and in that the semiconductor materials that are used for growing or epitaxing the isolation diodes or tunnel diodes have either an indirect band junction or an energetic band gap, which in each ease is somewhat higher than that of the semiconductor materials used beneath it.

With the light-emitting semiconductor device of the invention, which can also be characterized as a multi-wavelength diode, multiple photon emission peaks of differing wavelengths can be generated within one chip. The principle is based upon the fact that epitaxial semiconductor materials are grown on a suitable substrate. The light-emitting active zones, which are designed as pn or np junctions, are serially connected from the bottom to the top in the chip. Thus the connection is implemented epitaxially via dividing layers, such as isolation diodes, which are used as low-impedance resistors. These isolation diodes comprise an np or pn junction, on which a very low, opposite voltage falls.

According to an alternative embodiment, the object is attained in that the semiconductor structure is designed as a multi-wavelength diode that emits or absorbs a defined number of light wavelengths, in that between the lower active zone and the upper active zone one or more additional active zones are epitaxially grown, in that the lowest active zone has a low energetic band gap, with each subsequent active zone having a higher energetic band gap than a preceding active zone, and in that the dividing layer is designed as a metallic contact.

The alternative embodiment provides that a conductive, for example a metallic, contact is used as the intermediate layer for the serial connection.

It is provided that the material of the substrate is GaAs, Ge, InP, GaSb, GaP, InAs, Si, SiGe, SiC, SiGe: C, sapphire, or diamond.

It is further provided that the material of the active zones is or contains one or more of the following materials: GaAs, GaInP (suitable compositions), AlGaAs (many suitable compositions), GaInAs (suitable compositions), AlInGaP (many suitable compositions), GaAsN, GaN, GaInN, InN, GaInAlN (suitable compositions), GaAlSb, GaInAlSb, CdTe, MgSe, MgS, 6HSiC, ZnTe, CgSe, GaAsSb, GaSb, InAsN, 4H—SiC, α-Sn, BN, BP, BAs, AlN, ZnO, ZnS, ZnSe, CdSe, CdTe, HgS, HgSe, PbS, PbSe, PbTe, HgTe, HgCdTe, CdS, ZnSe, InSb, AlP, AlAs, AlSb, InAs and/or AlSb.

A band emission diode is characterized by the following structure:
  a GaAs or Ge substrate,
  a GaAs diode (lower diode) that is grown on the substrate,
  on top of this, in alternating sequence, an isolation diode, such as a GaInP isolation diode or an AlGaAs isolation diode, that is grown on the GaAs diode, followed by a GaInP diode or AlGaAs diode that is grown on the isolation diode, with the number of diodes (AZ1-Azn) defining the number of peaks in a band emission range.

The band emission range is defined in that the number of diodes and the number and width of the peak structure form a coincident light emission range in a way that could not be achieved with a single peak, thus a resulting emission range is obtained.

It is further provided that, on an active zone, an absorption layer containing the same material as the pn layer of the active zone is grown. This is implemented for the purpose of adjusting the intensity of emitted light from the relevant active zone in the case of serial connection.

Each of the individual active zones can also be equipped with metallic contacts of their own for connection to a connecting lead, for cases in which each active zone or selected individual active zones are to be separately activated.

A blended-color LED colored brown with only one chip preferably has the following structure:
  a GaA or Ge substrate,
  a lower active zone, grown on the substrate, made, for example, made of GaInP (also AlGaInP), whose suitable emission wavelength lies within the red range,
  a first isolation diode made of GaInP or AlGaInP, grown on the lower active zone, whose band energy is higher than that of the active zone beneath it,
  a center active zone made of AlInGaP, grown on the isolation diode, whose emission wavelength lies within the yellow range,
  a second isolation diode and whose band energy lies below the band energy of the active zone beneath it and
  an upper active zone made of AlInGaP, grown on the second isolation diode, whose emission wavelength lies within the green range.

Another preferred embodiment is characterized in that a blended-color LED comprises:
  a GaAs or Ge substrate (SUB),
  a lower active zone (AZ1), grown on the substrate, followed by two additional active zones (AZ2-AZn), between which a tunnel diode (TD1-TDn) is arranged, wherein the upper active zone (AZn) has a metallic contact (K) for connection with an electric terminal.

It can be provided that the metal contact that is arranged between the active zones is attached with adhesive, soldered, pressed, bonded or welded.

A portion of the desired blended colors is generated with 1-chip components having various active zones with isolation diodes, a second portion of the desired blended colors is generated with another chip, wherein the active zones are joined to one another via a metallic connection. Thus the entire spectrum of desired blended colors is created.

In one particularly preferred embodiment it is provided that the lower active zone is made of an AlInGaP material having a wavelength of approximately 620 nm, that the center active zone is made of an AlInGaP semiconductor material having a wavelength of approximately 550 nm, and that the upper active zone is made of a GaInN semiconductor material having a wavelength within the range of approximately 400 to 450 nm. In this embodiment the blended color "white" is created from a single chip.

A further preferred embodiment relates to the semiconductor structure, comprising the active zones, being designed as a blended-color sensor, wherein the active zones are designed as photodiodes. A preferred blended-color sensor has the following construction:
  a GaAs or a Ge substrate, on the underside of which a metallic contact is applied or grown, and on the upper side of which a GaInP or AlInGaP photodiode is applied or grown,
  that on the photodiode an np isolation diode made of an AlInGaP, AlGaAs or GaInP material is applied,
  a second pn-junction made of an AlInGaP photodiode,
  an np isolation diode and
  a third pn-junction as the GaAlN or AlGaInN photodiode.

In this it is provided that the first photodiode lies within a wave range of $\lambda=600$ nm to 680 nm, that the center photodiode lies within a wave range of $\lambda=550$ nm, and that the third photodiode lies within a wave range of $\lambda=400$ nm to 450 nm, and thus is a 1-chip white-light analyzer. Each of the light-detecting photodiodes is equipped with a metallic contact for connection to an electrical line.

With the design specified in the invention as a blended-color sensor, wherein the active zones are designed as photodiodes, incident blended-color light can be selectively absorbed in the associated active zones, so that a current that is generated therein can be selectively tapped.

The design as an AlGaInN photodiode offers the advantage that overall a white-light detector is created, which can analyze the three basic colors blue, green and red in their composition according to intensity, in other words using the generated current in the relevant active zones. Finally, the invention relates to the semiconductor structure with the active zones forming a colored display. In this, the colored display can comprise a plurality of light-emitting semiconductor devices according to the present invention, wherein a pixel of the colored display corresponds to a light-emitting semiconductor device, and wherein each pixel and the corresponding colors can be selectively activated.

BRIEF DESCRIPTION OF THE DRAWING

Further details, advantages and characterizing features of the invention are found not only in the claims and the characterizing features to be found therein-alone and/or in combination, but also in the following description of the exemplary embodiments illustrated in the set of drawings.

The drawings show.

DESCRIPTION OF THE PREFERRED EMBODIMENTS

Figure 1:
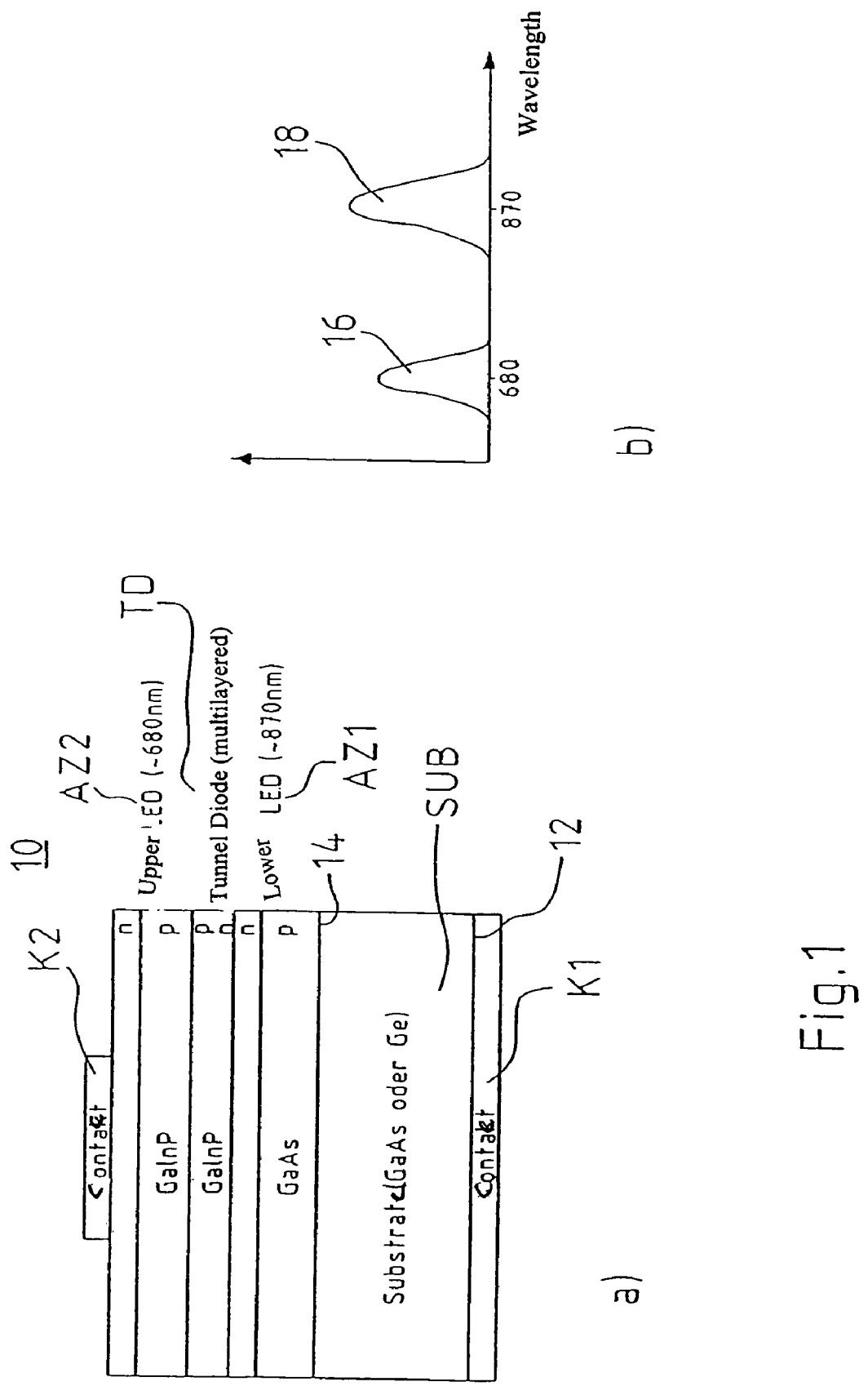
FIG. 1a, b a schematic configuration of a two-peak diode with associated wavelength intensity distribution, FIG. 2 an overview of material properties of various semiconductor materials, FIG. 3a, b an example of a band emission diode with associated exemplary wavelength intensity distribution FIG. 4a, b the exemplary band emission diode according to FIG. 3 with an absorption layer arranged between an active zone and an isolation diode, and exemplary wavelength intensity distribution, FIG. 5 a schematic configuration of an exemplary multi-wavelength diode with explicitly activatable active zones, FIG. 6a, b a schematic configuration of an exemplary blended color light-emitting diode (brown) with exemplary wavelength intensity distribution, FIG. 7a, b an exemplary schematic configuration of a blended-color light-emitting diode (white) with exemplary wavelength intensity distribution, FIG. 8a, b a schematic configuration of an exemplary blended-color sensor with associated wavelength intensity distribution, FIG. 9a, b a schematic configuration of an exemplary multi-peak light-emitting diode with isolation diode contacts or metal contacts and exemplary wavelength intensity distribution, FIG. 10 a schematic configuration of a semiconductor structure with separately activatable diode structures, FIG. 11 a schematic configuration of a semiconductor structure with separately activatable diode structures and FIG. 12 a schematic configuration of a colored display.
Figure 2:
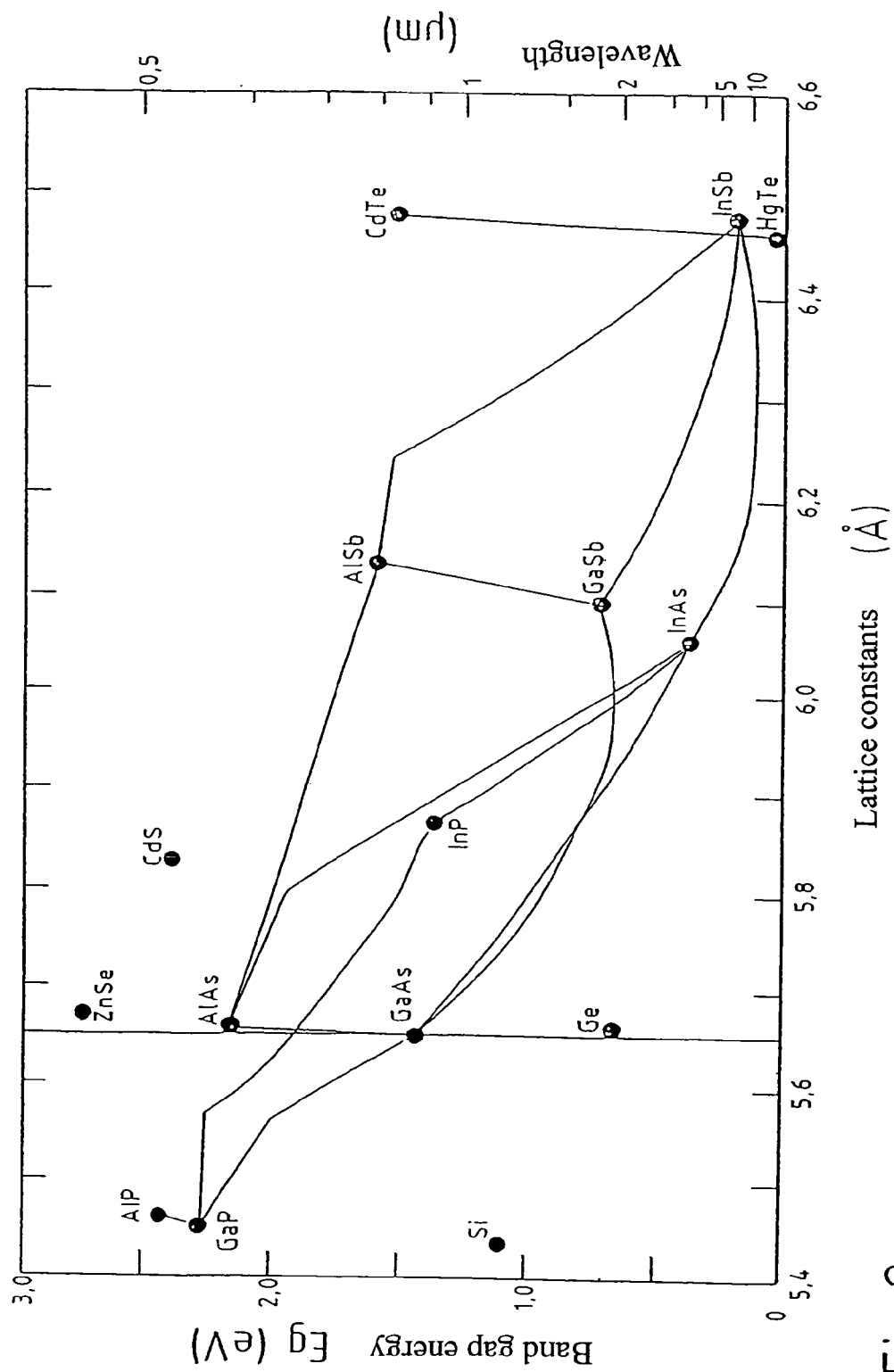

FIG. 1 shows a schematic configuration of a semiconductor structure 10 with active zones AZ, which structure can be characterized as a two-peak light-emitting diode. The two-peak diode 10 comprises a substrate SUB, which is made, for example, of GaAs or Ge material. A lower surface 12 of the substrate SUB is provided with a metallic contact K1, and a first (lower) active zone AZ1 is grown on an upper surface 14 as, for example, a GaAs diode. Above the lower active zone AZ1 a dividing layer TD1 is arranged as an isolation diode, for example a GaInP isolation diode, the thickness of which is approximately 40 nm. This isolation diode TD serves and acts as a low-impedance interconnect resistor for the serial connection of the lower active zones AZ1, which are designed as pn junctions. Above the tunnel diode TD, another, upper active zone AZ2 is grown, which is designed, for example, as a GaInP diode. FIG. 1b shows an exemplary spectral distribution, wherein a first peak 16 lies within the range of the wavelength 680 nm (GaInP) and a second peak 18 lies within the range of the wavelength 870 nm (GaAs).

The semiconductor materials that are used in the construction of the semiconductor device of the invention are preferably chosen according to the following criteria:

epitaxial growth on the substrate SUB is enabled, suitable band gap and suitable doping level, which generates the desired emission wavelength, the lowest pn junction AZ1 has the smallest energetic band gap for light generation, the active zones AZ1 through AZn arranged above the former and designed as pn junctions each have successively higher energetic band gaps, since otherwise the radiation emitted from the diode beneath LED1 will be absorbed, the band gap in the semiconductor materials from which the isolation diode TD is produced should also be higher than the energetic band gap of the active zone $AZ_x$ beneath said diode, since otherwise absorption will also occur there, wherein the isolation diode TD ideally comprises an indirect semiconductor junction, epitaxial, crystalline growth of the semiconductor materials that are used on the layer beneath it.

A semiconductor structure 10 with active zones, illustrated schematically in FIG. 1, represents the principle upon which a series of possible configurations can be based. Thus, for example, multi-peak diodes can be produced, to be intended for a specific application. Further, band emission diodes can be produced that emit light quasi-continuously from a specific initial wavelength to a specific final wavelength. Furthermore, blended-color LED's can be produced with only a single chip.

Below, additional schematic configurations of multi-wavelength diodes are described.

From the exemplary epitaxial map, for example, suitable material systems can be taken. For instance, the substrate SUB can be chosen as a GaAs substrate or as a Ge substrate. For epitaxial growth of active zones AZ, the following are examples of suitable materials: GaAs, GaInP (suitable compositions), AlGaAs (many suitable compositions), GaInAs (suitable composition), AlInGaP (many suitable compositions) or even GaAsN, GaN, InN, GaInN, GaInAlN (suitable compositions), GaAlSb, GaInAlSb, CdTe, HgTe, HgCdTe, CdS, ZuSe, InSb, AlP, AlAs, AlSb, InAs, AlSb, MgSe, MgS, 6HSiC, ZnTe, CdSe, GaAsSb, GaSb, InAsN, 4H—SiC, α-Sn, BN, BP, BAs, AlN, ZnO, ZnS, ZnSe, CdSe, CdTe, HgS, HgSe, PbS, PbSe, PbTe.

Other substrates may also be used, such as InP, GaSb, InAs, Si, GaP, diamond, sapphire, SiGe, SiC, SiGe: C and many others.

Figure 3:
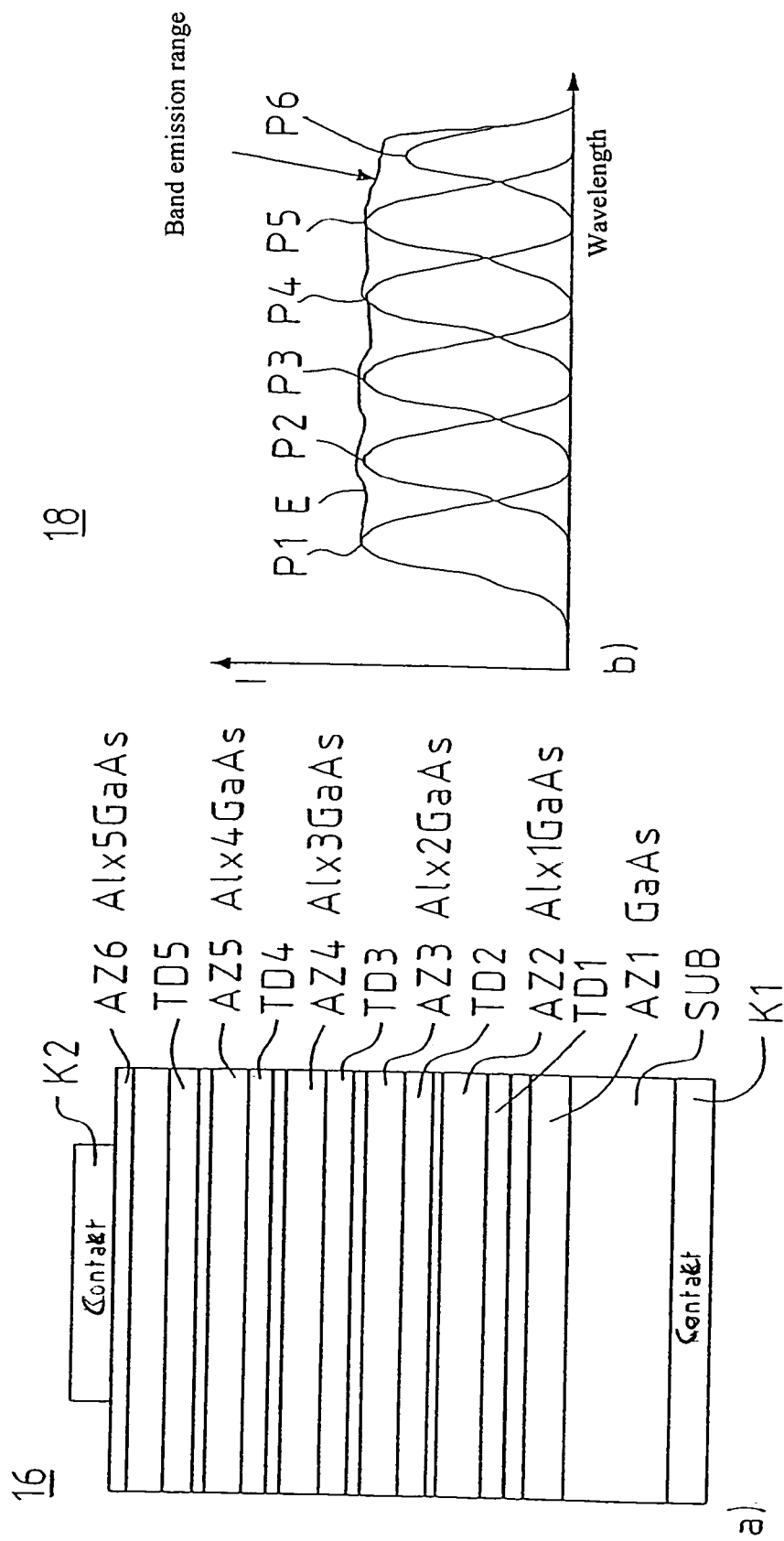

In FIG. 3, the configuration of an exemplary band emission diode 16 is schematically illustrated. The band emission diode 16 comprises a substrate SUB such as a GaAs or Ge substrate with a lower contact K1 and an active zone AZ1 that is grown on the substrate as a GaAs diode (lower diode). On the LED1, an isolation diode TD is provided as a low-impedance connecting resistor for serial connection to the next LED 2. The isolation diode TD1 is made of AlGaAs or GaInP. On top of this, the next active zone AZ2 is grown as a pn junction (AlGaAs diode with low Al content). Another np isolation diode TD2 is then inserted, so that ultimately isolation diodes TD and active zones AZ alternate. On the uppermost active zone AZ6 (for example) a contact K2 is provided.

A spectral distribution 18 is shown in FIG. 3b, which illustrates the course of six peaks P1-P6 and the resulting envelope curve E, which at the same time represents the band emission range.

If, for example, a GaAs diode having a wavelength range of λ=870 nm is used as the lower active zone AZ1, followed by an AlGaAs diode (λ of 875-625 nm, adjustable) as TD1 and then suitable compositions in the AlInGaP mixed-crystal system (λ of 650 nm to 540 nm, adjustable), then a band emission range E of λ=870 nm to 540 nm can be produced. This means a band emission ranging from infrared to green.

This concept also permits the production of band emission diodes having open ranges, in other words emission gaps.

Figure 4:
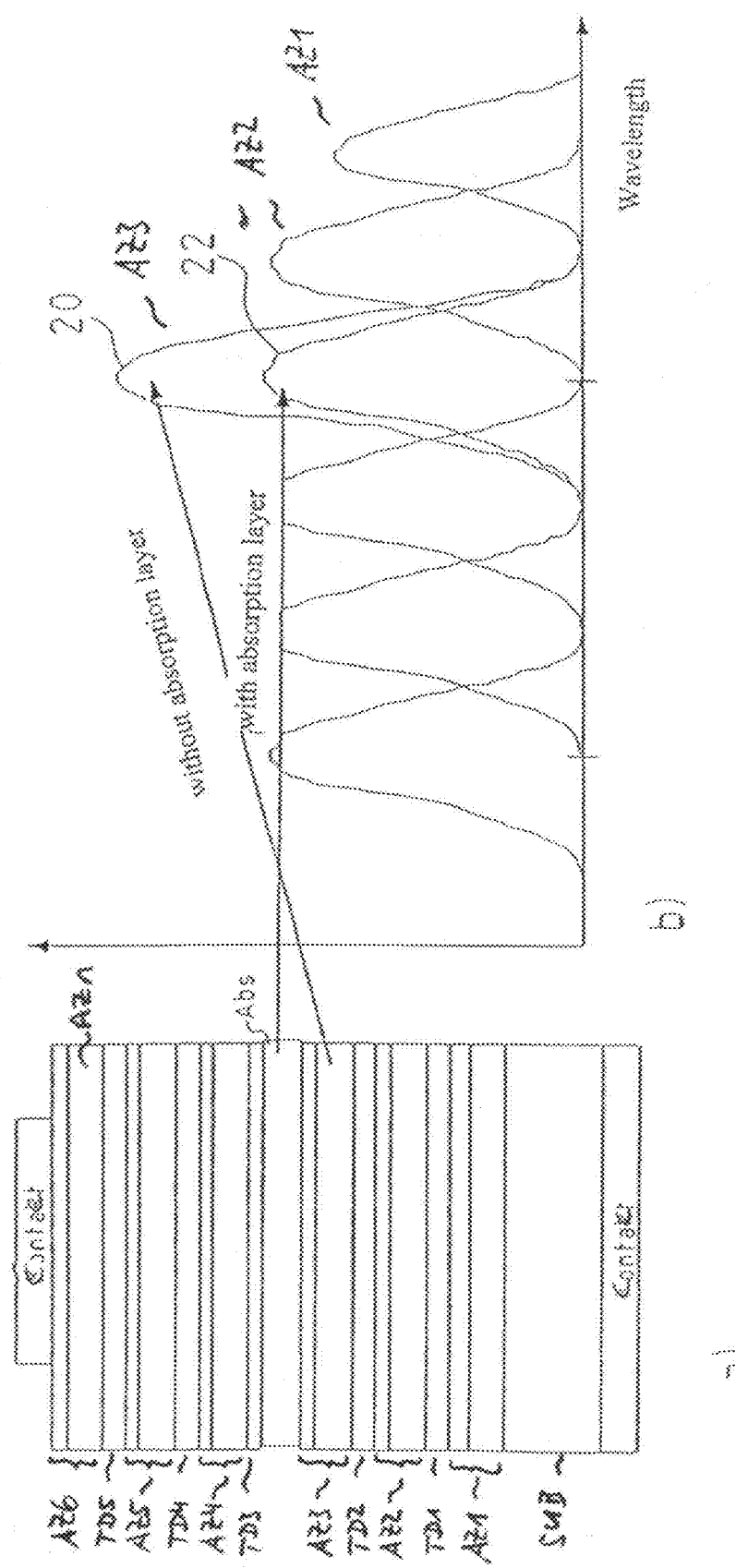

If the intensity of an individual active zone such as AZ3 (light-emitting diode)—as shown in FIG. 4a, b—exhibits a brighter or more intense peak 20, it is possible to place an absorption layer Abs of suitable thickness, and made of the same material from which the pn layer AZ3 is made, directly on top of the active zone AZ3.

FIG. 4b shows the peak 20 without an absorption layer and with a corrected peak 22 with an absorption layer ABS.

Figure 5:
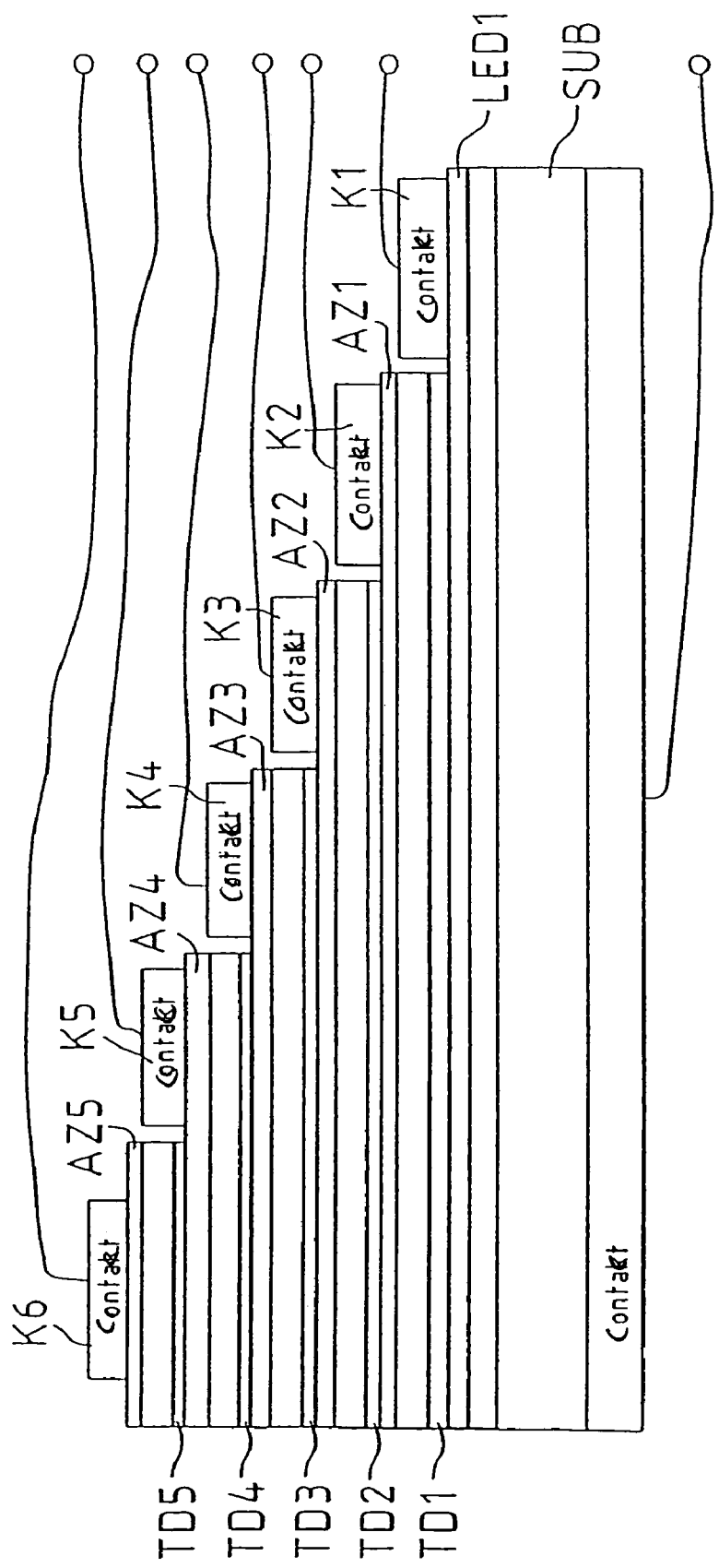

FIG. 5 shows a schematic configuration of a light-emitting semiconductor device 24, comprising a substrate SUB with active zones AZ1-AZ6 grown on said substrate, which are serially connected to one another via tunnel diodes TD1-TD5, which are arranged between the active zones AZ1-AZ6. The embodiment of the light-emitting semiconductor device 24 is characterized in that each active zone AZ1-AZ6 is equipped with a metallic contact K1-K6, with the possibility that within the semiconductor structure, which can also be characterized as multi-wavelength diode stacks, certain wavelength peaks can be explicitly activated using corresponding signals. In this manner it is possible to specifically control or regulate light-emission peaks, on the basis of their brightness/intensity, their color by selecting peaks, and their targeted blended-color or desired band emission partial areas.

Figure 6:
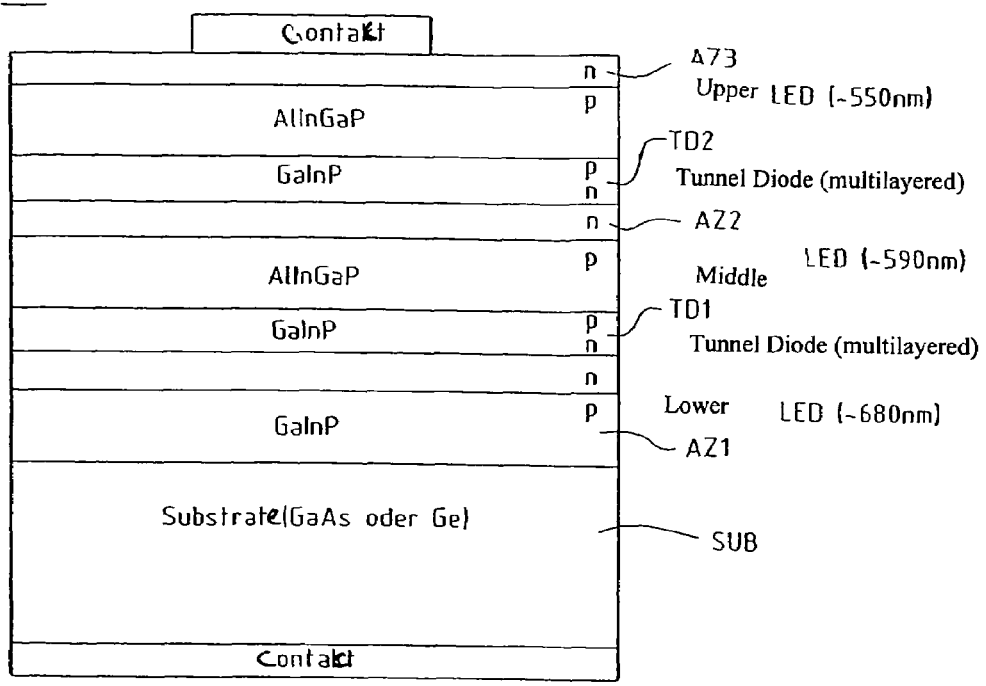
Figure 6:
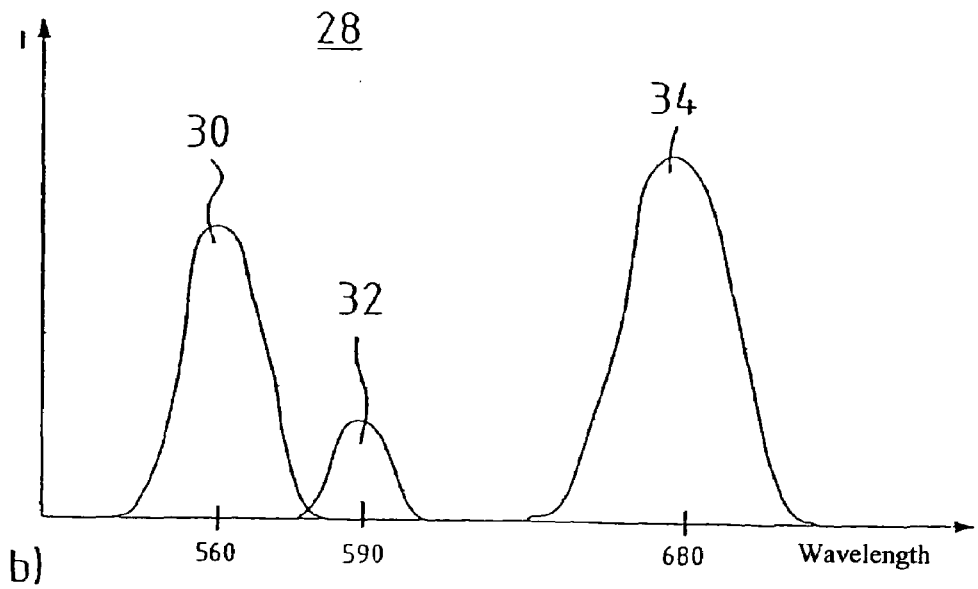

FIG. 6a shows a schematic arrangement of a light-emitting semiconductor device 26, which can be characterized as a blended-color LED and which gives off light in the color brown. The exemplary light-emitting semiconductor device 26 comprises a substrate SUB as a GaAs or Ge substrate. On this, a GaInP diode AZ1 is grown, which covers a wavelength range of approximately λ=680 nm. This is followed by an np isolation diode TD1. Preferably the isolation diode TD1 is designed to be multilayered and with a higher energetic band gap than AZ1, which is beneath it, and TD1 serves as a low-impedance connecting resistor for the serial connection to the next pn junction AZ2, which is designed in the material system AlInGaP with a wavelength λ of approximately 590 nm. Finally, another np isolation diode TD2 is grown, and on this a third pn junction as the active zone AZ3, which is designed with the material AlInGaP having a wavelength range λ of approximately 550 nm.

FIG. 6b shows a spectral distribution 28, which illustrates the course of three color peaks 30, 32, 34, which to the human eye gives the impression of a "brown LED". Because various brown tones are possible, the essential factor is the wavelength that is used and the intensity of the emission peaks 30, 32, 34 that is produced. The brown impression can be adjusted to be more reddish, yellowish or greenish.

Figure 7:
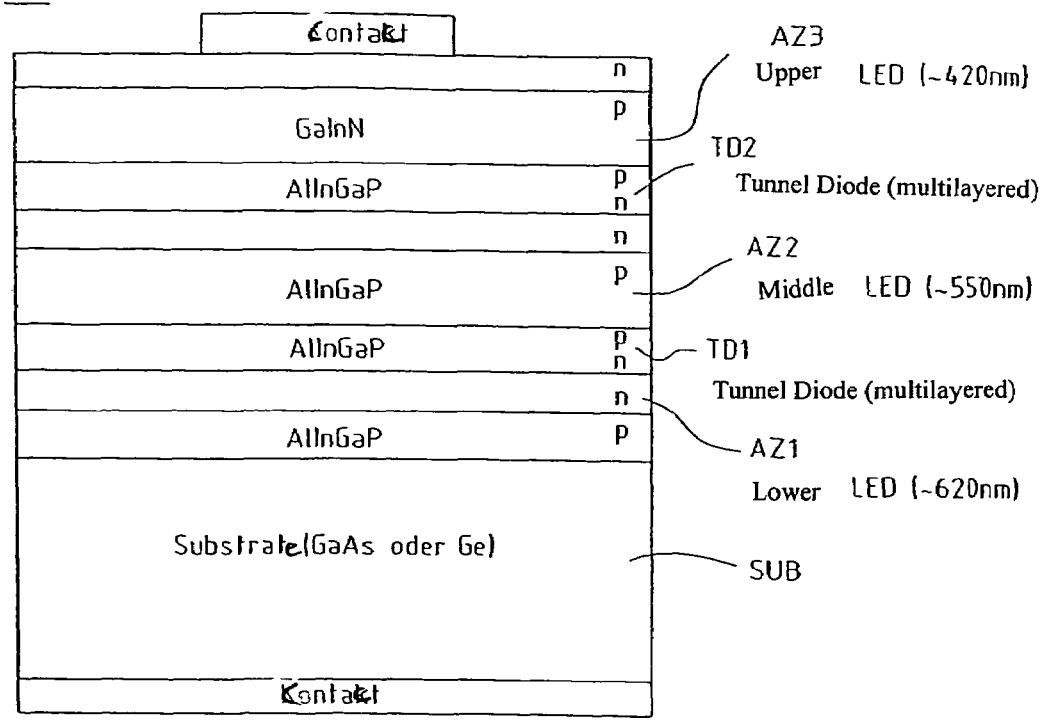
Figure 7:
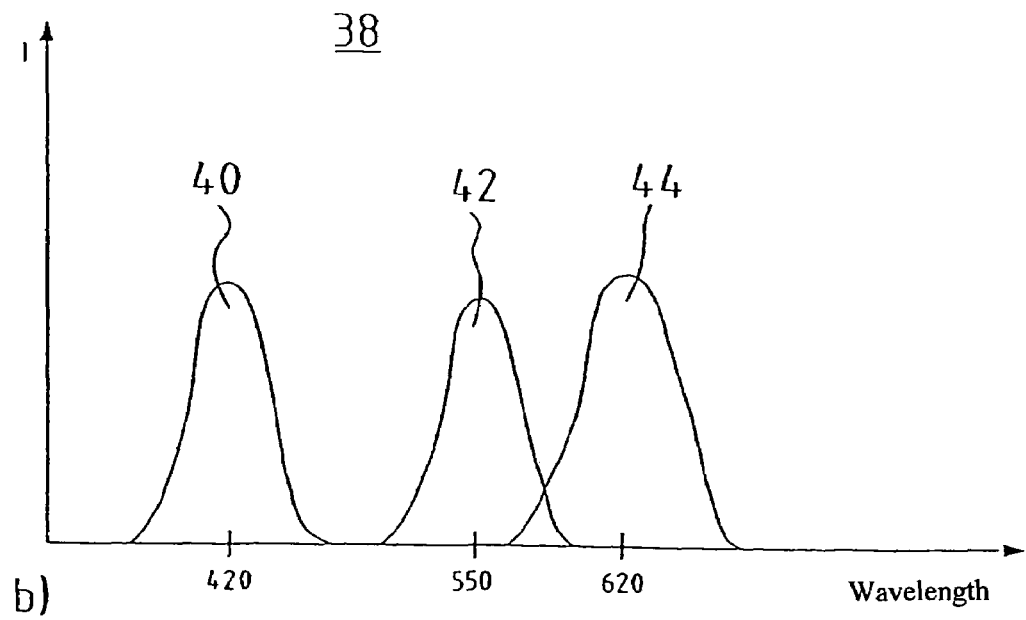

FIG. 7a shows the schematic configuration of a blended-color LED 36 designed to give off white light. The blended-color LED 36 comprises a substrate SUB, on which a lower active zone AZ1 made of AlInGaP material (colored red) is grown, followed by a tunnel diode TD1 made of AlInGaP material with a high band gap, a center active zone AZ2 made of AlInGaP material (colored green), another tunnel diode TD2 made of AlInGaP material (higher energetic band gap) and an upper active zone AZ3 made of GaInN material, or AlGaInN material in a wave range of λ approximately 400 nm to 450 nm.

A spectral distribution 38 is shown in FIG. 7b, and comprises three color peaks 40, 42, 44, which to the human eye create the impression of an LED having the color "white".

Because there are many white impressions, the wavelength that is used and the corresponding intensity of the emission peaks 40, 42, 44 is of decisive importance. The white impression can be adjusted to be more reddish, greenish or bluish.

Furthermore, the white color impression can be generated with every color of the chromaticity table whose direct connecting path runs through the illuminant (in the case of two colors). If three colors are used, a color triangle is spanned in the chromaticity table. Depending upon the use of the color and its intensity, the desired illuminant can also be achieved in this case. According to the above-mentioned principle, almost any number of blended colors is possible. The variation of the colors/wavelengths and their intensity levels must be determined according to the desired color tone.

Figure 8:
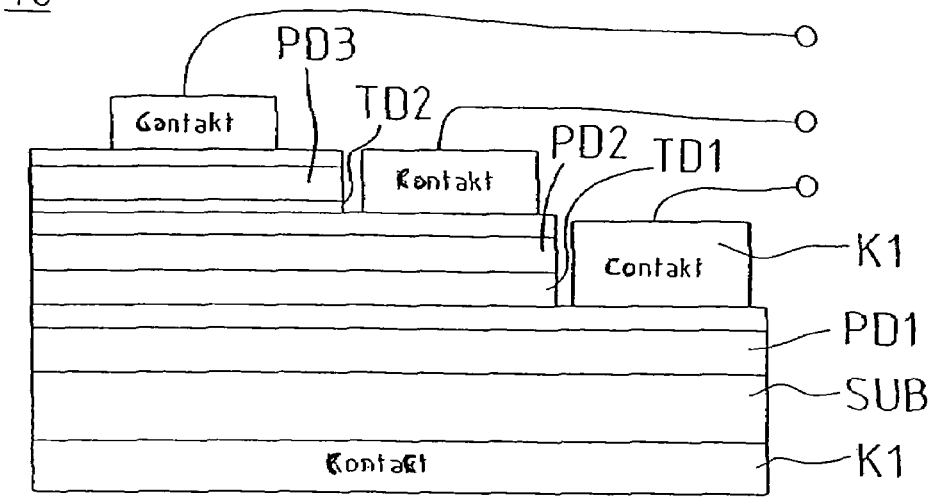
Figure 8:
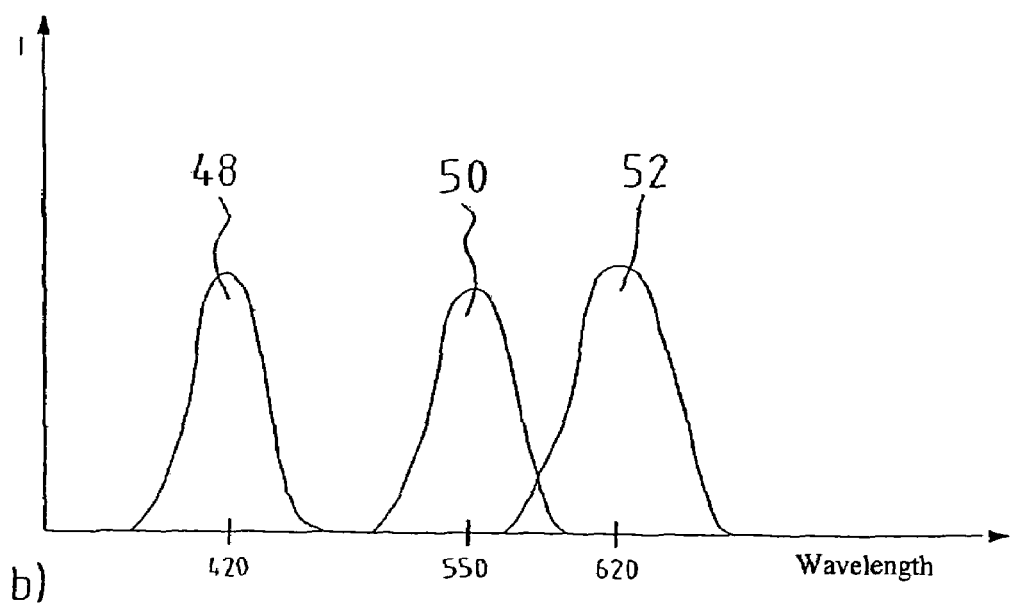

FIG. 8a shows a purely schematic configuration of a blended-color sensor 46, wherein the active zones PD1-PD3 are designed as photodiodes. The blended-color sensor 46 comprises a substrate SUB, on the underside of which a first electrical contact K1 is attached. On an upper side of the substrate SUB, by way of example, a first active zone PD1 is grown as a GaInP or AlInGaP photodiode, which covers a wavelength range λ of approximately 600 nm to 680 nm. The band gap of the material should be somewhat longer-wave than the light to be detected. On an in the sic area of the upper side of the photodiode PD1 an electrically conductive contact K1 is applied, and on another upper surface area an np isolation diode TD1 made of AlInGaP, AlGaAs or GaInP material is positioned, which serves as a low-impedance connecting resistor for serial connection to the second pn junction. On the isolation diode TD1 another photodiode PD2 is grown, which is designed as an AlInGaP diode in a wave range of λ= approximately 550 nm or somewhat longer-wave. On this, another np isolation diode TD2 is grown, followed by another photodiode PD3 as a GaInN diode with a wavelength in the range λ of 400 to 450 nm. The specific wavelengths of an RGB-white LED are selectively absorbed in the photodiode layers PD1-PD3 and generate an electrical signal, which can be read out and evaluated. Corresponding intensities of signals 48, 50, 52 are found in the intensity distribution according to FIG. 8b. According to the above-discussed principle, nearly any number of blended-color sensors is possible.

Figure 9:
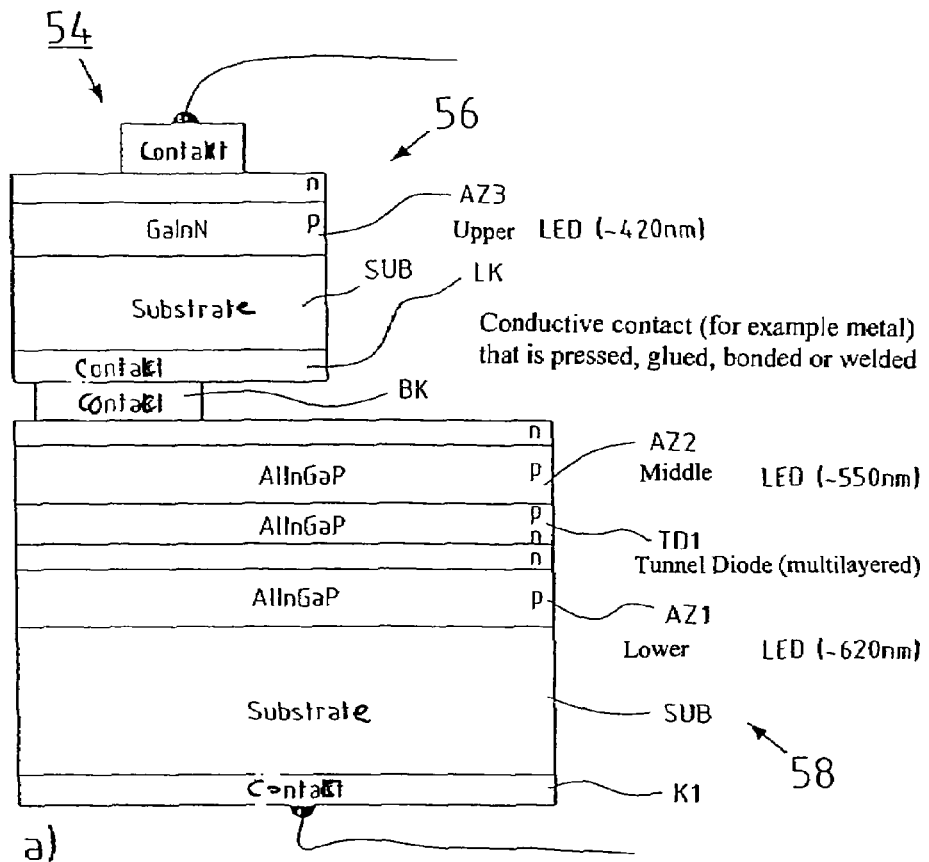
Figure 9:
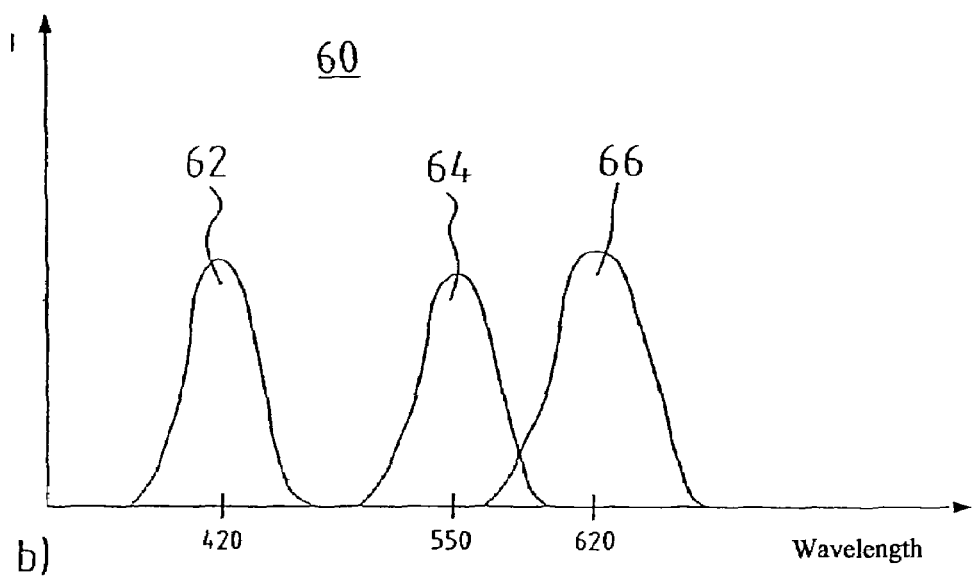

As described above, the multi-peak diodes or multi-wavelength diodes can be serially connected with isolation diode contacts TD1-TDn or with conductive contacts LK, which is described in the example of a white-luminous RGB diode 54 according to FIG. 9a. The blended-color LED 54 is comprised of a substrate SUB, with a contact K1 on its underside and a lower active zone AZ1, followed by an isolation diode TD1 and a center active zone AZ2; if it is not possible for certain material systems to grow on a system that is below them, for example due to too great a lattice mismatch, crystal structure, growth temperatures, etc., a conductive contact LK, such as a metal contact, can be used in the serial connection. Using chip-on-chip bonding, it can be attached with adhesive, soldered, bonded, welded or pressed, for example, whereby a contact between the two chips is enabled. A diode stack 58 consisting of the substrate (SUB), the active zone AZ1, the isolation diode TD1 and the center light-emitting diode AZ2 is equipped with only one bond contact BK on the surface. Another chip 56, comprising a substrate SUB and a light-emitting diode with the active zone AZ3, is connected via a metallic contact K, arranged on its underside, with the bond contact BK of the lower chip 58, so that a smooth transition is created.

For example, the configuration of the lower chip is characterized in that on a substrate such as a GaInP or AlInGaP diode AZ1 is grown as a light-emitting diode, with a wavelength λ in the range of 600 nm to 680 nm (red). On this, the np isolation diode TD1 is grown from AlInGaP, AlGaAs or GaInP material, which, as the low-impedance connecting resistor for the serial connection, results in the center pn-junction AZ2. The center pn-junction as a light-emitting diode LED2 is designed as an AlInGaP diode with a wavelength λ in the range of 550 nm (green). The light-emitting diode AZ2 is equipped with the conductive BK. With this chip 58 the upper chip 56 is fastened, for example glued, soldered, bonded, welded, pressed, etc., wherein said chip can emit the color blue and is made, for example, of a material such as GaInN, AlGaInN or GaN material with a transparent or conductive substrate. The diode AZ3 of the upper chip 56 has a wavelength λ in the range of approximately 400 to 450 nm.

A spectral distribution 60 is illustrated in FIG. 9b and shows the course of 3 color peaks 62, 64, 66, which to the human eye produce the impression of a white color.

Because there are many white combinations, the primary factor here as well is the wavelength that is used and the resulting intensity of the emission peaks. The white impression can be adjusted to appear more reddish, greenish or bluish.

The white color impression can be generated with any color in the chromaticity table, whose direct connection path runs through the illuminant (in the case of 2 colors). If three colors are used, a color triangle is spanned in the chromaticity table. Depending upon the use of the color and its intensity, the desired illuminant can also be achieved in this case. According to these principles, the realization of many blended colors is possible. The variation of the color/wavelength and the intensity must be coordinated for the desired color tone.

Figure 10:
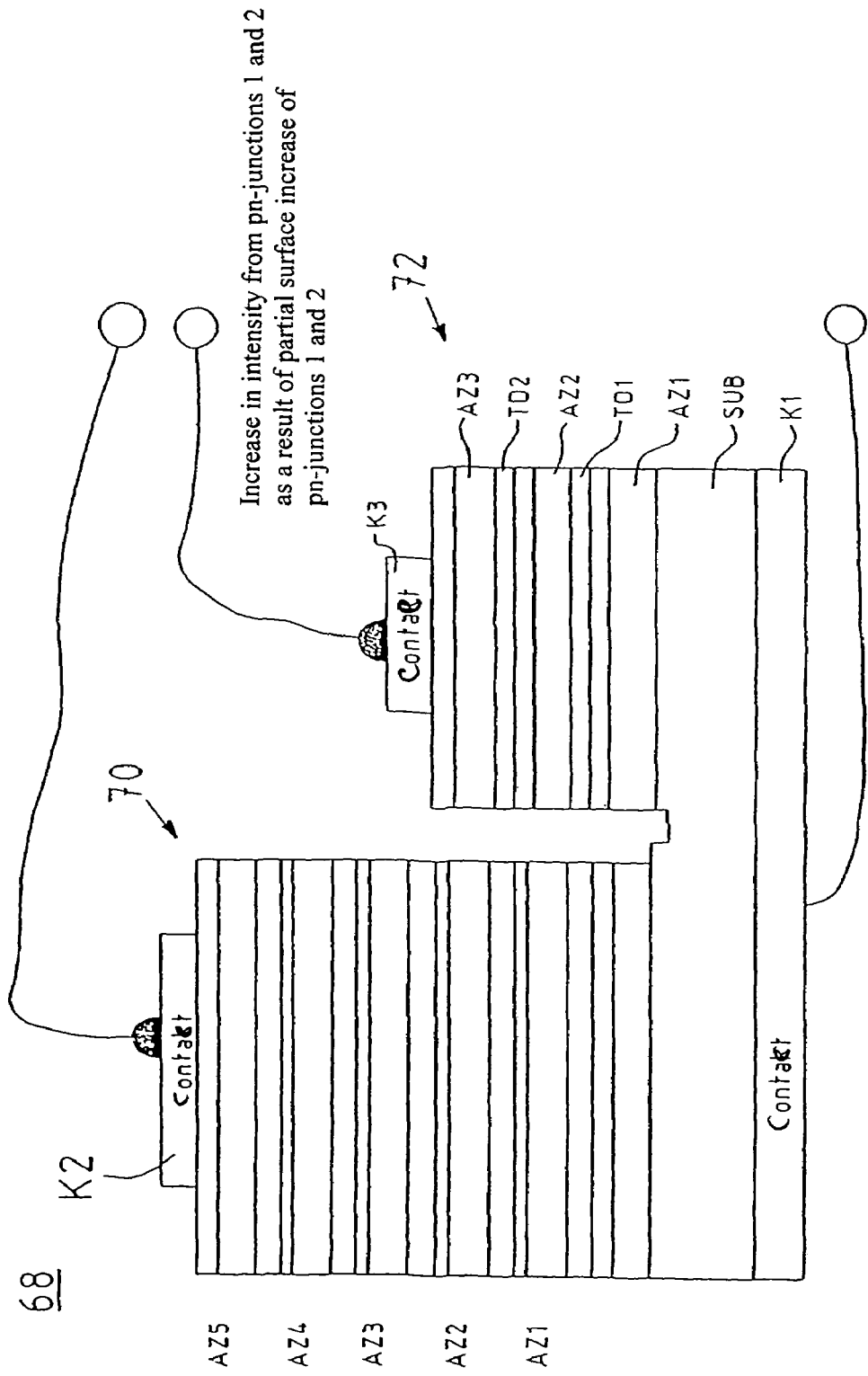
Figure 11:
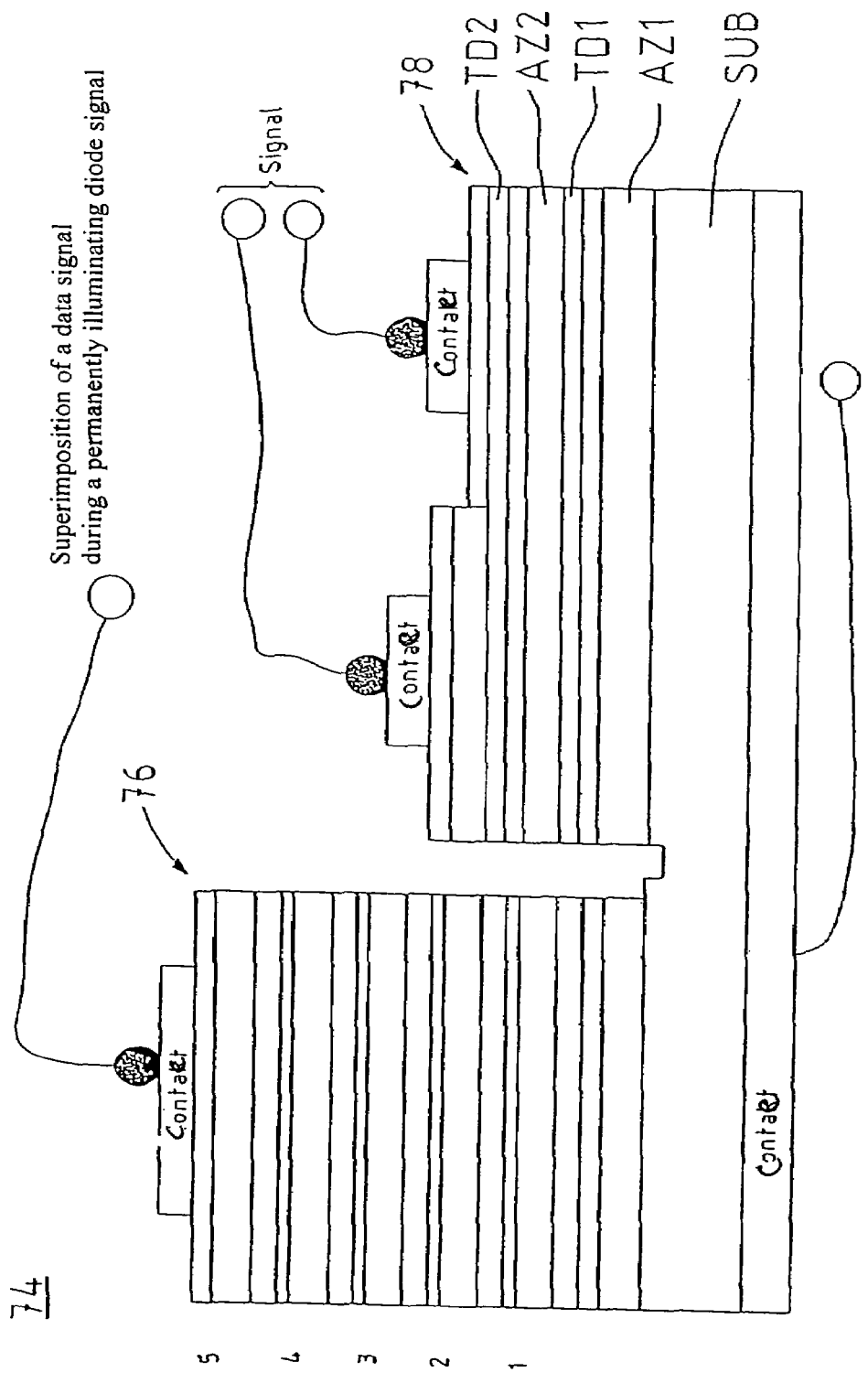

A further embodiment of a light-emitting semiconductor device 68 is illustrated in FIG. 10. This makes it possible for certain intensities of individual peaks to be parceled within the structural configuration and enables an intensity increase by means of the surface increase or surface enlargement. In addition, in this manner, for the entire structure it is also possible for only a partial area of the grown structure to be supplied with an electrical signal.

On a substrate SUB with a contact K1 that is arranged on the underside, the entire diode structure 70 is grown. By technological separation and technological removal of the grown structures, a reduced diode structure 72 can be obtained. The first diode structure 70 comprises a series of light-emitting diodes AZ1-AZ5, which are serially connected to one another via isolation diodes TD1-TD5. A contact K2 is applied to the uppermost AZ5.

The diode structure 72 further comprises, parallel to the diode layers of the diode stack 70, light-emitting diodes AZ1-AZ3, separated by isolation diodes TD1, TD2. A contact K3 is provided on the upper light-emitting diode AZ3.

With this arrangement, an increase in the intensity from light-emitting diodes AZ1, AZ2 and light-emitting diode AZ3 can be achieved by means of partial surface enlargement.

An alternative embodiment comprises a structural configuration 74, wherein on a substrate SUB two diode structures 76, 78 are arranged. The diode stack, as described above, comprises a series of, for example, five light-emitting diodes AZ1-AZ5, connected to one another via isolation diodes TD1-TD5.

The diode structure 78 comprises light-emitting diodes AZ1, AZ2, which are serially connected via isolation diodes TD1 and TD2. The structural configuration 74 is characterized in that through the partial area 78 the emitting light can also be provided with an electrical signal.

The above-described technological variants make it possible for certain intensity peaks to be parceled within the structural configuration 68, 74. In addition, as a result of the surface increase an increase in intensity can be enabled. Further, in this manner, for the entire structure 70, 72 or 76, 78 a partial area can be provided with an electrical signal.

Figure 12:
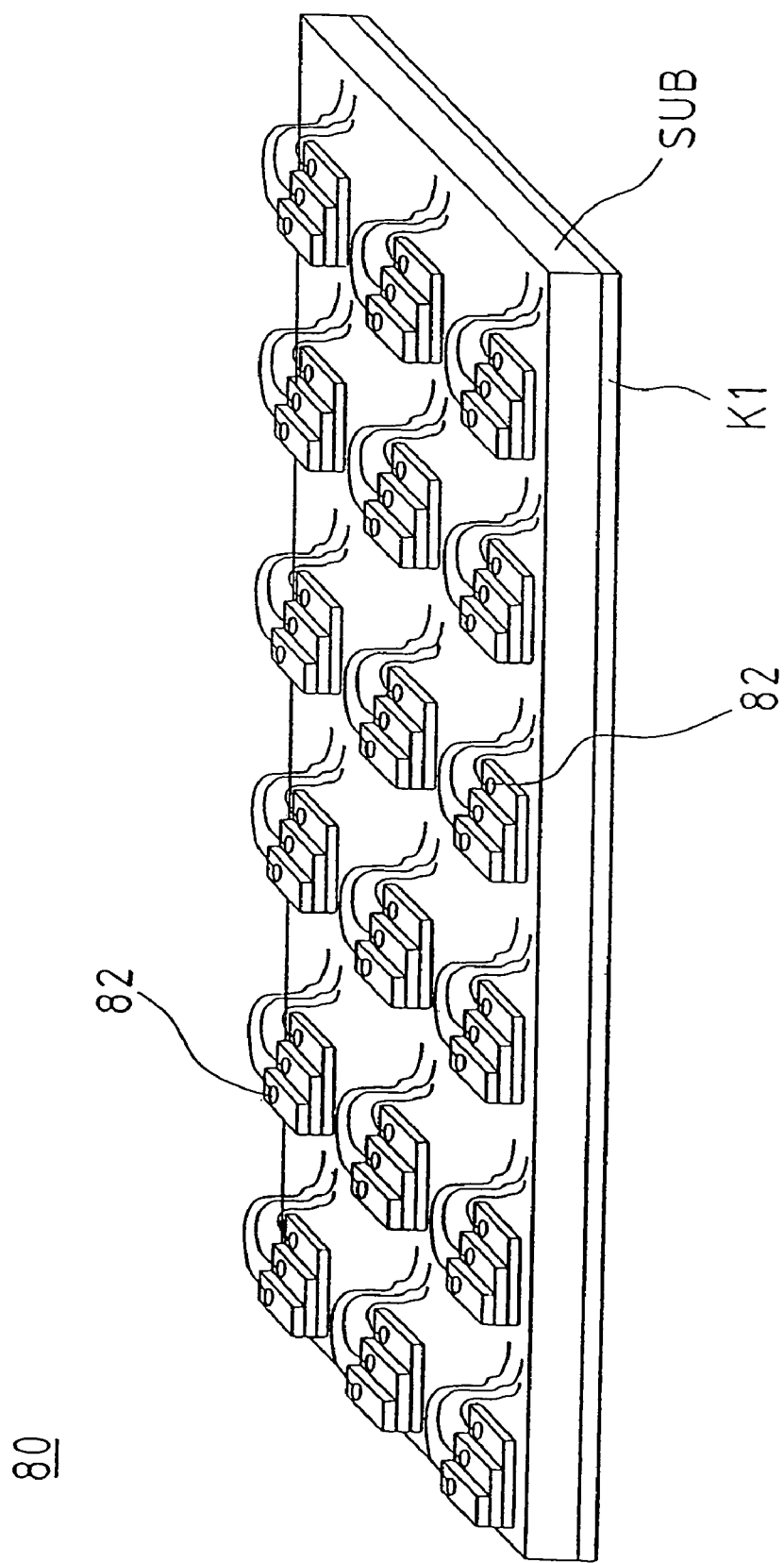

All the above-listed systematic and technological variants can be applied in a chip construction (this) or as a display. The schematic structure of a color display 80 is illustrated, for example, in FIG. 12, comprising a base substrate SUB with a lower contact K1, wherein for each pixel 82 corresponding colors can even be selectively activated.

The pixels 82 in this connection comprise a structure of the above embodiments described in connection with FIGS. 1-11. In these, an RGB chip is assumed. With this display configuration, display screens can be produced, which are very brightly illuminated and have a very high resolution due to a very small pixel construction.

The principle of the multi-wavelength diode can be used for a wide range of applications, for example:

in the illumination field due to the production of very bright white LED's and blended-color LED's using one chip,
multi-wavelength photodiodes (sensors) used in monitoring blended-color light and in detecting the composition of the light spectrum,
band emission diodes in sensor technology (spectral analysis, colorimetry, and much more),
the single-chip design can be manufactured according to individual specifications,
for small and medium-sized screen displays with very high resolution and luminous intensity,
for data transmission of differently colored signals with the same transmission frequency (glass-fiber transmission), etc.

The invention claimed is:

1. A multi-wavelength light-emitting diode, comprising a substrate (SUB) with a plurality of active zones ($AZ_1$-$AZ_n$), each of said active zones emitting light of a different wavelength, a first and lower active zone ($AZ_1$) of said active zones ($AZ_1$-$AZ_n$) being grown on a surface of the substrate (SUB), at least one upper active zone ($AZ_n$), and at least one further active zone ($AZ_2$-$AZ_{n-1}$) epitaxially grown between the lower active zone ($AZ_1$) and the upper active zone ($AZ_n$), the lower active zone ($AZ_1$) having a low energetic band gap and each subsequent active zones ($AZ_2$-$AZ_n$) having a higher energetic band gap than a previous active zone, the active zones being serially connected from the lower active zone ($AZ_1$) to the upper active zone ($AZ_n$) via at least one dividing layer ($TD_1$-$TD_n$) that serves as a low impedance resistor and as a substrate for growing a further or upper active zone, the at least one dividing layer being designed as a reciprocally polar np or pn junction in the form of an isolation diode or tunnel diode, and semiconductor materials used for growing or epitaxing the isolation diodes or tunnel diodes (TD) having either an indirect band junction or an energetic band gap, which in each case is higher than semiconductor materials that are used beneath it, wherein an absorption layer ($Abs_s$) is grown directly on an upper surface of at least one active zone ($AZ_1$-$AZ_n$), the absorption layer being formed of a material which is the same as a pn layer of the active zone on which the absorption layer is grown, and which adjusts intensity of light emitted by the at least one active zone on which the absorption layer is grown to generate multiple photon-emission peaks of differing wavelengths with substantially equalized intensities within the multi-wavelength diode.

2. A light-emitting diode with active zones according to claim 1, wherein the material of the substrate (SUB) is selected from the group consisting of GaAs, Ge, InP, GaSb, GaP, InAs, Si, SiGe, SiC, SiGe:C, sapphire, and diamond.

3. A light-emitting diode with active zones according to claim 1, wherein the active zones (($AZ_1$-$AZ_n$) contain at least one material selected from the group consisting of GaAs, GaInP AlGaAs, GaInAs AlInGaP, GaAsN, GaN, GaInN, InN, GaInAlN, GaAlSb, GaInAlSb, CdTe, MgSe, MgS, 6HSiC, ZnTe, CgSe, GaAsSb, GaSb, InAsN, 4H——SiC, a-Sn, BN, BP, BAs, AlN, ZnO, ZnS, ZnSe, CdSe, CdTe, HgS, HgSe, PbS, PbSe, PbTe, HgTe, HgCdTe, CdS, ZnSe, InSb, AlP, AlAs, AlSb, InAs, and AlSb.

4. A light-emitting diode with active zones according to claim 1, wherein:
the substrate (SUB) is GaAs or Ge,
the lower active zone is a GaAs lower diode ($AZ_1$) grown on the substrate,
grown on top of lower diode ($AZ_1$), in alternating sequence, is an isolation diode, followed by at least one said further active zone which is a GaInP diode ($AZ_3$) or Al-GaAs diode ($AZ_3$-$AZ_n$) grown on the isolation diode,
the band emission range being defined in that the number of diodes ($AZ_1$-$AZ_n$) and the number and the width of the peaks define a coincident light emission range which could not be achieved with a single peak, thus a resulting creation of an emission range.

5. A light-emitting diode with active zones according to claim 1, wherein each of the individual active zones ($AZ_1$-$AZ_n$) is equipped with a metallic contact for connection to a connecting lead.

6. A light-emitting diode with active zones according to claim 1, wherein the light-emitting diode is a blended-color LED (brown), and wherein:
the substrate (SUB) is GeAs or Ge,
the lower active zone ($AZ_1$) is made of GaInP or AlGaInP, grown on the substrate,
a first said dividing layer is grown on the lower active zone and is a first isolation diode ($TD_1$) made of GaInP or AlGaInP,
the at least one further active zone is a center active zone ($AZ_2$) made of AlInGaP, grown on the first isolation diode,
a second said dividing layer is a second isolation diode ($TD_2$) grown on the at least one center active zone, and
the upper active zone ($AZ_3$) is made of AlInGaP, grown on the second isolation diode.

7. A light-emitting diode with active zones according to claim 1, wherein the light-emitting diode is a blended-color LED, and wherein:
the substrate (SUB) is GeAs or Ge,
the lower active zone ($AZ_1$) is grown on the substrate, followed by two said further active zones, between which a tunnel diode is arranged, with the upper active zone ($AZ_n$) having a metallic contact for connection with an electrical terminal.

8. A light-emitting diode with active zones according to claim 1, wherein the lower active zone ($AZ_1$) is made of an AlInGaP material having a wavelength of approximately 620 nm, the at least one further active zone ($AZ_2$) is made of an AlInGaP semiconductor material having a wavelength of approximately 550 nm, and the upper active zone ($AZ_3$) is made of a GaInN semiconductor material having a wavelength of approximately 400 to 450 nm.

9. A light-emitting diode with active zones according to claim 1, wherein the upper active zone ($AZ_n$) has a contact which is a bond contact.

10. A light-emitting diode with active zones according to claim 1, wherein the light-emitting diode with the active zones forms a colored display.

11. A light-emitting diode with active zones according to claim 10, wherein the colored display is formed from a plurality of said light-emitting diodes, one pixel of the colored display corresponding to a light-emitting diode, and each pixel and the corresponding colors being selectively activated.

* * * * *